(12) United States Patent
Ueno et al.

(10) Patent No.: US 6,812,536 B2
(45) Date of Patent: Nov. 2, 2004

(54) MOSFET WITH GRADED GATE OXIDE LAYER

(75) Inventors: Shuichi Ueno, Tokyo (JP); Yukio Nishida, Tokyo (JP); Hiroshi Umeda, Tokyo (JP); Kenichi Ohto, Tokyo (JP); Takashi Terauchi, Tokyo (JP); Shigeru Shiratake, Tokyo (JP); Akinori Kinugasa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 31 days.

(21) Appl. No.: 10/383,753

(22) Filed: Mar. 10, 2003

(65) Prior Publication Data

US 2004/0046219 A1 Mar. 11, 2004

(30) Foreign Application Priority Data

Sep. 6, 2002 (JP) .................................... 2002-261130

(51) Int. Cl.[7] .............................................. H01L 29/76
(52) U.S. Cl. ...................... 257/413; 257/288; 257/368; 257/411; 257/406; 438/585; 438/587; 438/588; 438/592
(58) Field of Search ................................. 257/413, 288, 257/368, 411, 406, E21.625, E21.639; 438/585–588, 592, 954, 981, 197

(56) References Cited

U.S. PATENT DOCUMENTS 6,455,383 B1 * 9/2002 Wu ............................. 438/296

FOREIGN PATENT DOCUMENTS

JP          2002-76336          3/2002

* cited by examiner

Primary Examiner—Nathan J. Flynn
Assistant Examiner—Scott R. Wilson
(74) Attorney, Agent, or Firm—Oblon, Spivak, McClelland, Maier & Neustadt, P.C.

(57) ABSTRACT

A smile oxide film, serving as a gate oxide film, is formed under a three-layer poly-metal gate consisting of a doped polysilicon layer, a tungsten layer, and a SiON layer. The smile oxide film has a first region located beneath an edge of the poly-metal gate and a second region located beneath a central portion of the poly-metal gate. A film thickness of the first region is larger than a film thickness of the second region. An anti-oxidizing film, having a small oxygen diffusion rate compared with the polysilicon layer, entirely covers the poly-metal gate without exposing.

10 Claims, 23 Drawing Sheets

X: OXIDATION INCOMPLETE
○: OXIDATION COMPLETE

F I G. 4 9
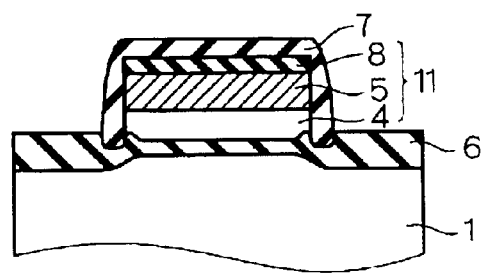
F I G. 5 0
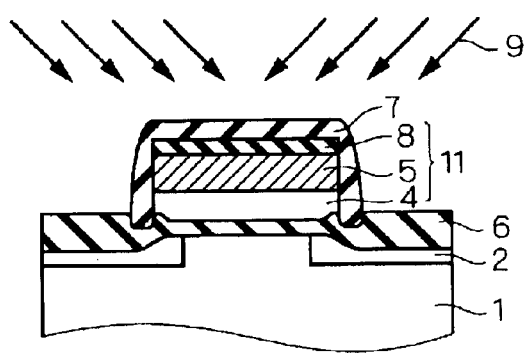
F I G. 5 1
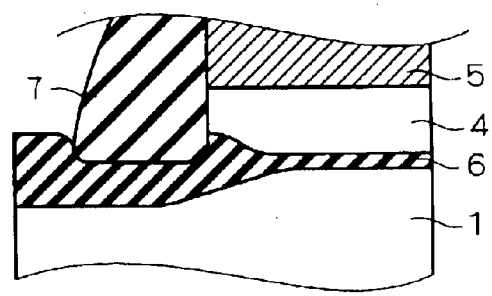

F I G . 5 2
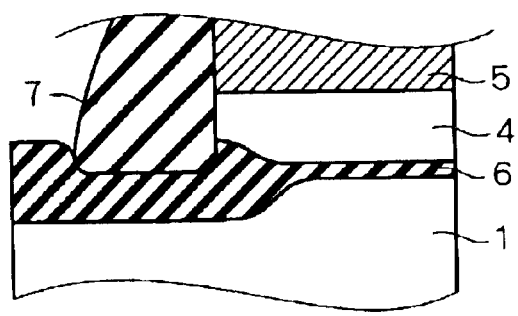
F I G . 5 3
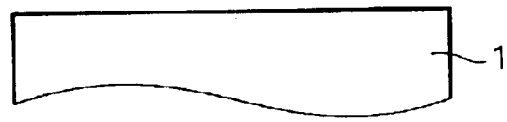
F I G . 5 4
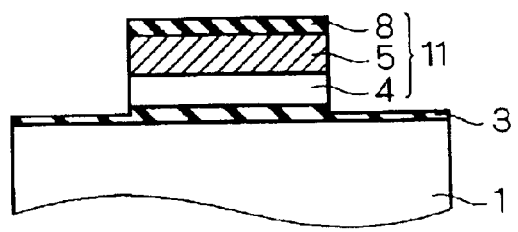

MOSFET WITH GRADED GATE OXIDE LAYER

BACKGROUND OF THE INVENTION

1. Field of the Invention

The present invention relates to a semiconductor device and more particularly to a structure of a MOS (i.e., metal-oxide semiconductor) transistor.

2. Description of the Background Art

The gate electrode of a MOS transistor serves as part of wiring. In this respect, it is desirable to reduce the resistance of gate electrode lines as much as possible. However, the recent semiconductor devices continue to downsize to smaller dimensions. This forcibly narrows the width of respective gate electrode lines. The resistance of gate electrode lines increases correspondingly, inducing a problem that the undesirable voltage drop occurs or the response is delayed. To solve this problem, a conventionally proposed prospective method is to employ a poly-metal gate (i.e., a combination of polysilicon and metal) as the gate electrode.

FIG. 59 is a cross-sectional diagram showing the arrangement a MOS transistor having a poly-metal gate structure which is disclosed in Japanese Patent Application Laid-Open No. 2002-76336.

As shown in the drawing, source and drain regions 52 are selectively formed in an upper layer portion of a silicon substrate 51. Extensively overlying on the upper surface of the silicon substrate 51 is a $SiO_2$ film 53 which serves as a gate oxide film. A doped polysilicon layer 54, formed on the $SiO_2$ film 53, extends in a limited region corresponding to a gap between the source and drain regions 52. Formed on the doped polysilicon layer 54 is a tungsten layer 55. The doped polysilicon layer 54 and the tungsten layer 55 cooperatively constitute a poly-metal gate 50.

Smile Oxidation

An edge portion of the gate electrode partly overlaps with an impurity diffusion area of the source and drain regions 52 which has a relatively high impurity concentration. When a voltage of an accumulation direction is applied on the gate electrode, for example, when the gate voltage is smaller than the drain voltage in a NMOS transistor, there is a tendency that a leak current, so-called GIDL (i.e., gate induced drain leakage current), may flow in this overlap region.

FIG. 60 is a cross-sectional diagram explaining the GIDL phenomenon. As shown in this drawing, an inner depletion layer 61 and an outer depletion layer 62 appear along the boundary of the source or drain region 52 in accordance with the potential distribution. In this case, the upper edge of the inner depletion layer 61 develops under a region of the $SiO_2$ film 53 located just beneath the doped polysilicon layer 54. The upper portion of depletion layer 61 elongated in this manner under the doped polysilicon layer 54 is a high electric field region 63 positioned adjacently to the edge of the doped polysilicon layer 54. The electric field of the gate edge portion can be simply expressed by $\{(Vg-Vd)/tOX\}$, where Vg represents a gate voltage, Vd represents a drain voltage, tOX represents a gate oxide film thickness. One of the methods for suppressing the GIDL phenomenon is a smile oxidation.

FIG. 61 is a cross-sectional diagram explaining the smile oxidation. The smile oxidation (also referred to as a poly-smile oxidation as a light thermal reoxidation) is a technique for forming a smile oxide film 56 by performing an oxidation process after forming a gate electrode. As shown in FIG. 61, the smile oxide film 56 has a large film thickness at the limited region near the gate edge.

Having a large film thickness at the region near the gate edge makes it possible for the smile oxide film 56 to relax the electric field in the vicinity of the gate edge portion. The GIDL phenomenon can be reduced correspondingly. Furthermore, the smile oxide film 56 has a relatively thin film thickness at the central region of the gate. Hence, the smile oxide film 56 can minimize the reduction in the drain current during an ON state.

Selective Oxidation

From the foregoing description, the ordinary person skilled in the art will simply expect that applying the smile oxidation process to the poly-metal gate structure may bring the effects of lowering the gate resistance and suppressing the GIDL phenomenon.

FIG. 62 is a cross-sectional diagram explaining a problem occurring when the smile oxidation process is applied to the poly-metal gate structure. Needless to say, it is well known that the metals, such as iron, copper, and aluminum, are readily oxidized as apparent from the generation of rust caused when the metals are oxidized.

In general, tungsten (W) is a metal material generally used for forming the poly-metal gate structure. However, compared with other metals, tungsten (W) is not an exception in that tungsten (W) easily bonds with oxygen to form an oxide having a higher resistance value. More specifically, as shown in FIG. 62, applying the smile oxidation process to the poly-metal gate structure causes the oxidation in the tungsten layer 55 and leaves an affected tungsten layer 55o. The resistance value of the poly-metal gate becomes large due to the presence of thus formed affected tungsten layer 55o. This is a problem to be solved in realizing an excellent poly-metal gate structure sufficiently low in the resistance value. From the view point that the capability of reducing the sheet resistance cannot be enjoyed when the metal is oxidized, this problem is fatal and will result in a negation of metal use.

To overcome this problem, there is known a conventional method according to which a selective oxidation technique is employed for performing the smile oxidation. The selective oxidation technique is characterized by an oxidation process performed in a strong reducing atmosphere, for example, containing a large amount of hydrogen. According to the selective oxidation technique, the oxide of tungsten (W), if it is once produced by the bonding of W and oxygen, promptly reduces to original W and oxygen. Thus, it becomes possible to minimize the chemical reaction to be caused between the tungsten (W) and oxygen.

However, the selective oxidation technique requires a sensitive or exquisite control for properly maintaining the balance between two directly-opposed, i.e., oxidation and reducing, phenomena. Accordingly, the required manufacturing or fabricating conditions are very severe. There is no degree of freedom. Simultaneously supplying both of oxygen and hydrogen significantly limits the temperature in the forming process for the purpose of avoiding possible dangers.

FIG. 63 is a cross-sectional diagram (Part I) explaining a problem peculiar to the selective oxidation process. As shown in FIG. 63, when the smile oxide film 56 having a sufficient thickness is formed in the vicinity of the edge, it is necessary to shorten the process time in view of the cost (or throughput) requirements. To this end, the process temperature needs to be maintained at a higher level. However, the above-described limit of the temperature in the forming process substantially prohibits the process being performed in such a higher temperature environment. On the other hand, if the supply of hydrogen is reduced to maintain the balance between the oxidation and reducing phenomena during the selective oxidation process, it will be unable to sufficiently suppress the oxidation of W.

From the foregoing reasons, as shown in FIG. 63, at least part of the tungsten layer 55 turns into the affected tungsten layer 55o as a result of oxidation. The gate resistance increases. In this manner, the selective oxidation technique requires a sensitive or exquisite control for properly maintaining the balance between two directly-opposed, i.e., oxidation and reducing, phenomena. From this fact, an upper limit of the film thickness of the smile oxide film, in the vicinity of the edge, is undesirably restricted to a smaller value. Furthermore, if the process time is elongated to obtain a sufficient film thickness under given conditions, it is needles to say that the throughput will be worsened.

FIG. 64 is a cross-sectional diagram (Part II) explaining a problem peculiar to the selective oxidation process. As shown in FIG. 64, the metal/poly interface (i.e., an interface between the doped polysilicon layer 54 and the tungsten layer 55) is also oxidized during the selective oxidation process. This induces a fatal problem that the interfacial resistance undesirably increases at the metal/poly interface.

SUMMARY OF THE INVENTION

It is an object of the present invention to provide a semiconductor device capable of realizing a low resistance gate electrode and also capable of reducing a leak current.

The present invention provides a semiconductor device including a semiconductor substrate, source and drain regions, a gate oxide film, a gate electrode, and an anti-oxidizing film. The source and drain regions are selectively formed in an upper layer portion of the semiconductor substrate. The gate oxide film is formed on the semiconductor substrate at least in a region between the source and drain regions. The gate electrode is formed on the gate oxide film and includes at least a polysilicon layer. The gate oxide film has a first region located beneath an edge of the gate electrode and a second region located beneath a center of the gate electrode. A film thickness of the first region of the gate oxide film is larger than a film thickness of the second region of the gate oxide film. The source and drain regions, the gate oxide film and the gate electrode cooperatively constitute a MOS transistor. The anti-oxidizing film has a small oxygen diffusion rate compared with the polysilicon layer, which covers the gate electrode so that the gate electrode is not exposed.

As the polysilicon layer is completely covered by the anti-oxidizing film, the first region of the gate oxide film located beneath the edge of the gate electrode becomes thick compared with the second region located beneath the center of the gate electrode. Thus, it becomes possible to suppress the oxidation in the polysilicon layer, even if the thermal treatment is performed to obtain the arrangement capable of suppressing the leak current.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 46 through 50 are cross-sectional diagrams showing a third manufacturing method of the MOS transistor in accordance with the tenth embodiment of the present invention;

FIG. 51 is a cross-sectional view showing a swelling portion of the smile oxide film in accordance with the MOS transistor arrangement of the ninth embodiment of the present invention;

FIG. 52 is a cross-sectional view showing a swelling portion of the smile oxide film in accordance with the MOS transistor arrangement of an eleventh embodiment of the present invention;

FIGS. 53 through 58 are cross-sectional diagrams showing a manufacturing method of the MOS transistor in accordance with the eleventh embodiment of the present invention;

DESCRIPTION OF THE PREFERRED EMBODIMENTS

<Principle of the Invention>
(Follower-type Smile Oxidation)

Figure 1:
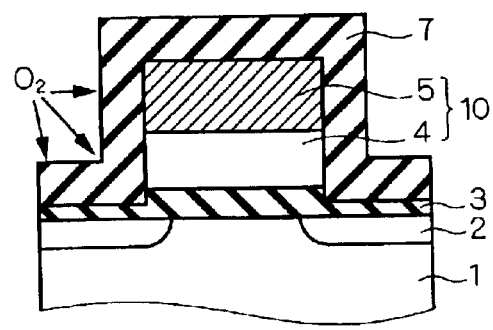
FIGS. 1 through 5 are cross-sectional diagrams explaining the principle of the present invention.

FIGS. 1 through 5 are diagrams explaining the principle of the present invention. As shown in FIG. 1, source and drain regions 2 are selectively formed in an upper layer portion of a silicon substrate 1. Extensively overlying on the upper surface of the silicon substrate 1 is a $SiO_2$ film 3. A doped polysilicon layer 4, formed on the $SiO_2$ film 3, extends in a limited region corresponding to a gap between the source and drain regions 2 and 2. Formed on the doped polysilicon layer 4 is a tungsten layer 5. The doped polysilicon layer 4 and the tungsten layer 5 cooperatively constitute a poly-metal gate 10. The $SiO_2$ film 3 underlying the poly-metal gate 10 serves as a gate oxide film. This structure shows a MOS transistor having a typical poly-metal gate arrangement.

The present invention is characterized in that an anti-oxidizing film 7 such as $Si_3N_4$ covers entirely the outer surface of the doped polysilicon layer 4 and the tungsten layer 5 without exposing. No outer surface of the doped polysilicon layer 4 and the tungsten layer 5 is exposed to the surrounding atmosphere. Then, a smile oxidation process follows the provision of the anti-oxidizing film 7. In this respect, the smile oxidation of this embodiment is referred to as a follower-type smile oxidation.

Figure 2:
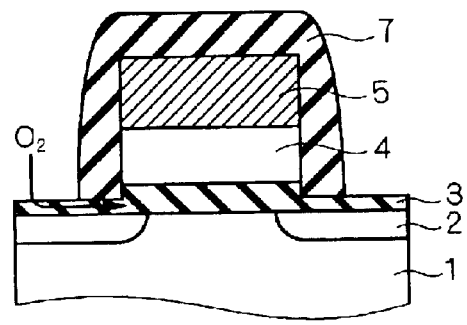
Figure 3:
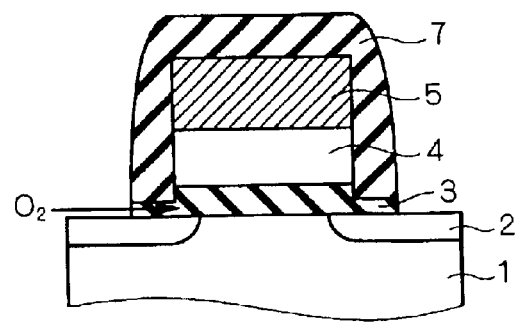

According to the condition of FIG. 1, the $SiO_2$ film 3 is also covered by the anti-oxidizing film 7. It is thus difficult to secure an oxidizing path reaching the doped polysilicon layer 4 for forming a smile oxide film. Hence, as shown in FIG. 2, the anti-oxidizing film 7 is configured, by etch back, into a sidewall structure so that the $SiO_2$ film 3 is partly exposed to the surrounding atmosphere. In this case, as shown in FIG. 3, it is preferable to remove the $SiO_2$ film 3 at the region where no anti-oxidizing film 7 is provided. Furthermore, it is preferable to partly cut and remove the surface of the silicon substrate 1.

As shown in FIGS. 2 and 3, baring or exposing at least partly the $SiO_2$ film 3 makes it possible to secure an oxidizing path reaching the doped polysilicon layer 4 from the upper surface or a side surface of the $SiO_2$ film 3.

Figure 4:
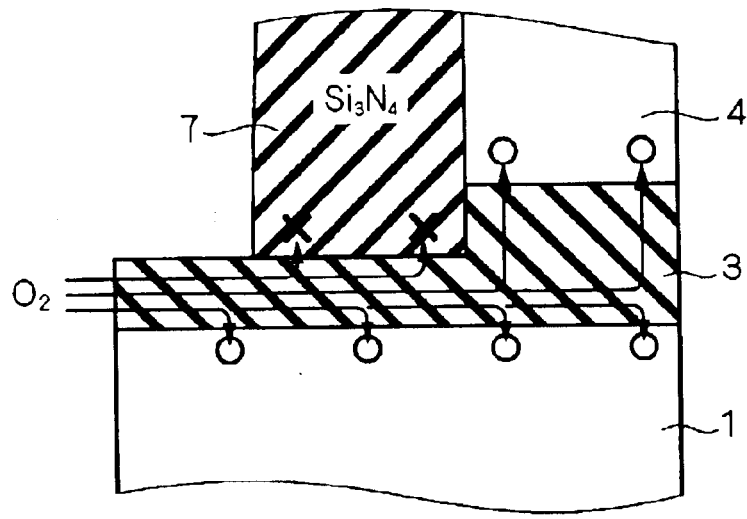

When the oxidation process is applied to the structure shown in FIG. 2, oxygen passes or penetrates the $SiO_2$ film 3 possessing a higher diffusion speed and leaves an oxide film extending into the doped polysilicon layer 4 beyond the interface between the $SiO_2$ film 3 and the doped polysilicon layer 4, as well as an oxide film extending into the silicon substrate 1 beyond the interface between the $SiO_2$ film 3 and the silicon substrate 1, as shown in FIG. 4.

Figure 5:
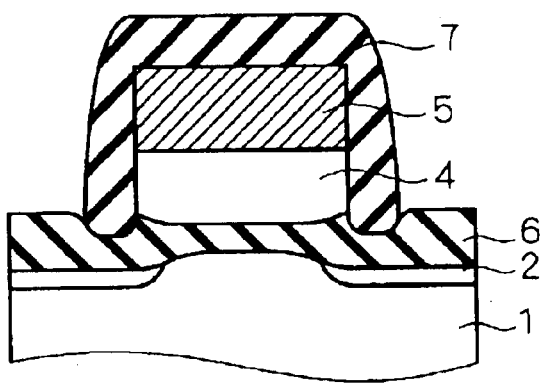

Meanwhile, it is hard for the oxygen to cause a chemical reaction with the anti-oxidizing film 7. The oxidation does not develop into the anti-oxidizing film 7. As a result, as shown in FIG. 5, the resultant smile oxide film 6 has a characteristic structure having a swelling portion in the vicinity of each gate edge (i.e., near the doped polysilicon layer 4) with a central region having a narrower thickness.

The important thing to be noted in this case is the fact that the oxygen completely turns into an oxide in the doped polysilicon layer 4 and does not reach the metal layer (i.e., the tungsten layer 5). In other words, there is no possibility that the metal layer will oxidize during the smile oxidation process. The resistance value of the metal layer does not increase. Accordingly, it becomes possible to form the smile oxide film 6 while effectively solving the above-described conventional problem.

As long as the smile oxide film 6 remains in the doped polysilicon layer 4, it can be concluded that the oxygen has not reached the tungsten layer 5 via the doped polysilicon layer 4.

Selective Oxidation+Follower-type Smile Oxidation

Figure 6:
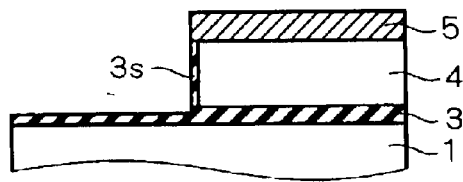
FIG. 6 is a cross-sectional diagram explaining the structure of a MOS transistor having been subjected to a selective oxidation process.

FIG. 6 shows the MOS transistor arrangement obtained by performing the selective oxidation process before forming the anti-oxidizing film 7. As shown in FIG. 6, performing the selective oxidation process after forming the doped polysilicon layer 4 and the tungsten layer 5 makes it possible to selectively form a sidewall oxide film 3s exclusively on the side surface of the doped polysilicon layer 4.

Figure 7:
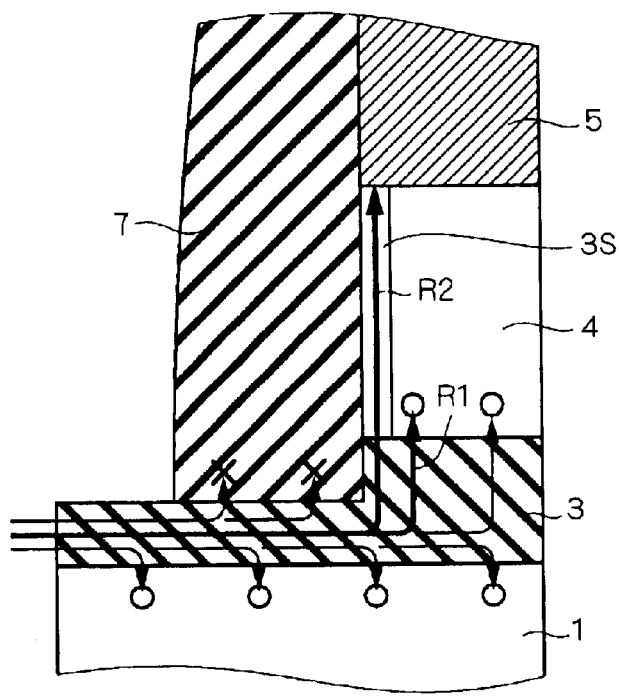
FIG. 7 is a cross-sectional diagram explaining the condition of a smile oxide process performed after accomplishing the selective oxidation process.

Subsequently, as shown in FIG. 7, the anti-oxidizing film 7 is formed on the sidewall oxide film 3s thus formed, with the etch back being applied succeedingly. Then, the follower-type smile oxidation is performed. In this case, the oxidizing velocity (i.e., the rate of oxidation) in the oxidizing path R1 extending from the $SiO_2$ film 3 into the doped polysilicon layer 4 via the interface therebetween is competitive with the oxidizing velocity (i.e., the rate of oxidation) in an oxidizing path R2 extending from the $SiO_2$ film 3 into the sidewall oxide film 3s.

Accordingly, as one of mandatory conditions, it is necessary to accomplish the oxidation process of the doped polysilicon layer 4 occurring in the oxidizing path R1 before the oxygen reaches and oxidizes the tungsten layer 5.

However, this method requires two oxidation processes being performed separately. Compared with the case that only the follower-type smile oxidation is performed, this method brings the effect of increasing the thickness of the smile oxide film 6.

<First Embodiment>

Figure 8:
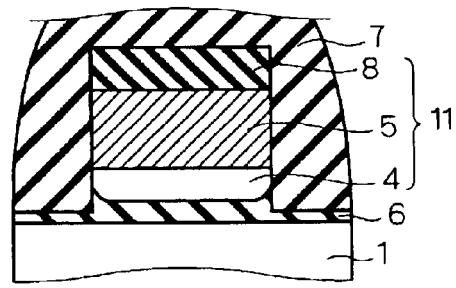
FIG. 8 is a cross-sectional diagram showing the gate arrangement of a MOS transistor in accordance with a first embodiment of the present invention.

FIG. 8 is a cross-sectional diagram showing the gate arrangement of a MOS transistor in accordance with a first embodiment of the present invention. As shown in this drawing, the smile oxide film 6 is formed on the upper surface of the silicon substrate 1. The poly-metal gate 11, consisting of the doped polysilicon layer 4, the tungsten layer 5, and an SiON layer 8, is formed on the smile oxide film 6. A portion of the smile oxide film 6 positioned beneath the three-layer poly-metal gate 11 serves as a gate oxide film. Then, the anti-oxidizing film 7 entirely covering the poly-metal gate 11 is formed. The illustration of FIG. 8 omits the source and drain regions.

The smile oxide film 6 is thicken at a portion near each edge of the three-layer poly-metal gate 11 compared with the central portion thereof. In other words, the smile oxide film 6 intrudes locally into the doped polysilicon layer 4 at the portions corresponding to the edges of the doped polysilicon layer 4. The three-layer poly-metal gate 11, due to the presence of the SiON layer 8 included therein, possesses the capability of protecting the tungsten layer 5 and the doped polysilicon layer 4 during the succeeding processes.

The arrangement of the first embodiment can be obtained by performing the above-described follower-type smile oxidation process after forming the three-layer poly-metal gate 11 and the anti-oxidizing film 7.

The arrangement of the first embodiment is characterized in that the three-layer poly-metal gate 11 is entirely covered without exposing by the anti-oxidizing film 7 which is made of a material having an oxygen diffusion rate smaller than that of the polysilicon. Accordingly, the tungsten layer 5 is shield by the doped polysilicon layer 4 and the anti-oxidizing film 7. For example, when the anti-oxidizing film 7 is made of $Si_3N_4$ having an oxygen diffusion rate of approximately 0, the oxygen diffusion rates are differentiated in the order of $SiO_2$, polysilicon, and $Si_3N_4$. Alternatively, it is possible to use SiON as a material for the anti-oxidizing film 7.

Accordingly, the first embodiment makes it possible to form the smile oxide film 6 having a swelling portion (i.e., a portion having a thickened width) at each gate edge while suppressing the increase of the sheet resistance induced by the oxidation in the tungsten layer 5. As a result, it becomes possible to realize a MOS transistor arrangement satisfying both of two requirements: i.e., reduction of the gate electrode resistance and reduction of the leak current (GIDL).

According to the disclosed arrangement of the first embodiment, the central portion of the smile oxide film 6 is 5 nm in thickness. The anti-oxidizing film 7 is made of $Si_3N_4$ with a film thickness of 2 nm. The doped polysilicon layer 4, having a phosphorus concentration of $1 \times 10^{22}/cm^3$, is 50 nm in film thickness. The tungsten layer 5 is 100 nm in film thickness. The SiON layer 8 is 60 nm in film thickness. Furthermore, the smile oxide film 6 can be formed into a multilayered structure consisting of a hi-k material and an oxide film. It is also possible to replace the SiON layer 8 with a $Si_3N_4$ layer.

<Second Embodiment>

Figure 9:
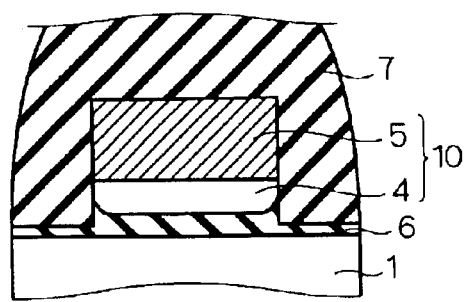
FIG. 9 is a cross-sectional diagram showing the gate arrangement of a MOS transistor in accordance with a second embodiment of the present invention.

FIG. 9 is a cross-sectional diagram showing the gate arrangement of a MOS transistor in accordance with a second embodiment of the present invention. As shown in this drawing, the poly-metal gate of the second embodiment is a two-layer poly-metal gate 10 consisting of the doped polysilicon layer 4 and the tungsten layer 5. The rest of the second embodiment is identical with that of the first embodiment.

The arrangement of the second embodiment can be obtained by performing the follower-type smile oxidation process after forming the poly-metal gate 10 and the anti-oxidizing film 7.

According to the arrangement of the second embodiment, the tungsten layer 5 shield by the doped polysilicon layer 4 and the anti-oxidizing film 7. The anti-oxidizing film 7 is made of a material having an oxygen diffusion rate smaller than that of the polysilicon. In other words, the tungsten layer 5 is not exposed to the oxygen elements at all. Thus, it is possible to surely prevent the tungsten layer 5 from being oxidized.

Accordingly, like the first embodiment, the second embodiment makes it possible to provide a MOS transistor arrangement capable of reducing the gate electrode resistance and also reducing the leak current.

According to the disclosed arrangement of the second embodiment, the central portion of the smile oxide film 6 is 5 nm in thickness. The anti-oxidizing film 7 is made of $Si_3N_4$ with a film thickness of 2 nm. The doped polysilicon layer 4, having a phosphorus concentration of $1 \times 10^{22}/cm^3$, is 50 nm in film thickness. The tungsten layer 5 is 100 nm in film thickness.

<Third Embodiment>

Figure 10:
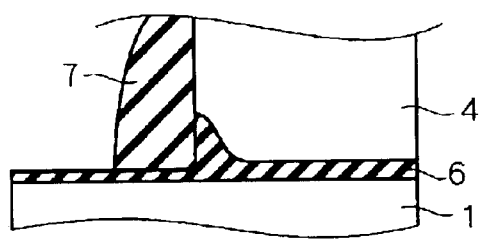
FIG. 10 is a cross-sectional diagram showing the gate arrangement of a MOS transistor in accordance with a third embodiment of the present invention.

FIG. 10 is a cross-sectional diagram showing the gate arrangement of a MOS transistor in accordance with a third embodiment of the present invention. As shown in this drawing, the third embodiment is characterized by a single-layer gate structure consisting of only the doped polysilicon layer 4. The illustration of FIG. 10 omits the source and drain regions.

As shown in FIG. 10, according to the third embodiment, no oxide region is formed along almost all of the sidewall of the doped polysilicon layer 4 which constitutes the single-layer structure. More specifically, the smile oxide film 6, formed on the upper surface of the silicon substrate 1, is partly oxidized at a limited region corresponding to the edge of the doped polysilicon layer 4.

The arrangement of the third embodiment can be obtained by performing the follower-type smile oxidation process after forming the anti-oxidizing film 7 entirely covering the doped polysilicon layer 4.

Accordingly, the third embodiment provides a MOS transistor arrangement with a single-layer polysilicon gate which is capable of reducing the leak current.

According to the disclosed arrangement of the third embodiment, the thickness of the smile oxide film 6 is 5 nm at the central portion thereof and is maximized to 10 nm at the portion corresponding to the edge of the doped polysilicon layer 4. The doped polysilicon layer 4 has a phosphorus concentration of $1 \times 10^{22}/cm^3$.

<Fourth Embodiment>

Figure 11:
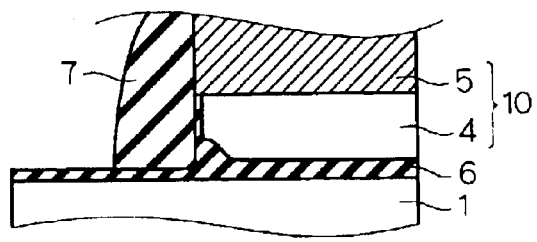
FIG. 11 is a cross-sectional diagram showing the gate arrangement of a MOS transistor in accordance with a fourth embodiment of the present invention.

FIG. 11 is a cross-sectional diagram showing the gate arrangement of a MOS transistor in accordance with a fourth embodiment of the present invention. As shown in this drawing, the doped polysilicon layer 4 and the tungsten layer 5 cooperatively constitute the two-layer poly-metal gate 10. The anti-oxidizing film 7 entirely covers the poly-metal gate 10. The illustration of FIG. 11 omits the source and drain regions.

As shown in FIG. 11, the fourth embodiment is characterized in that the smile oxide film 6, basically underlying the doped polysilicon layer 4, also extends along the side surface of the doped polysilicon layer 4. The oxidation, however, does not develop into the interface (i.e., a poly/metal interface) between the doped polysilicon layer 4 and the tungsten layer 5.

The arrangement of the fourth embodiment can be obtained by performing the follower-type smile oxidation process after forming the poly-metal gate 10 and the anti-oxidizing film 7. The smile oxide film 6 is formed along the side surface of the doped polysilicon layer 4 during the follower-type smile oxidation process. In this case, to surely form the smile oxide film 6 along the side surface of the doped polysilicon layer 4, it is preferable to exclusively apply the selective oxidation process to the side surface of the doped polysilicon layer 4 prior to the formation of the anti-oxidizing film 7.

Accordingly, the fourth embodiment provides a MOS transistor arrangement which is capable of reducing the gate electrode resistance as an effect of using the tungsten layer 5 and is also capable of reducing the leak current as an effect of forming the smile oxide film 6.

According to the disclosed arrangement of the fourth embodiment, the thickness of the smile oxide film 6 is 5 nm at the central portion thereof and is maximized to 10 nm at the portion corresponding to the edge of the doped polysilicon layer 4. The sidewall portion of the smile oxide film 6 is 2 nm in thickness. The doped polysilicon layer 4 has a phosphorus concentration of $1 \times 10^{22}/cm^3$.

<Fifth Embodiment>

Figure 12:
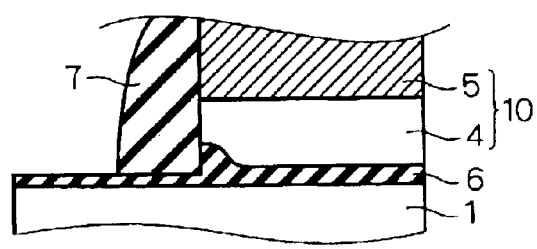
FIG. 12 is a cross-sectional diagram showing the gate arrangement of a MOS transistor in accordance with a fifth embodiment of the present invention.

FIG. 12 is a cross-sectional diagram showing the gate arrangement of a MOS transistor in accordance with a fifth embodiment of the present invention. As shown in this drawing, the doped polysilicon layer 4 and the tungsten layer 5 cooperatively constitute the two-layer poly-metal gate 10. The anti-oxidizing film 7 entirely covers the poly-metal gate 10. The illustration of FIG. 12 omits the source and drain regions. As shown in FIG. 12, the fifth embodiment is characterized in that the smile oxide film 6 chiefly underlies the doped polysilicon layer 4 with the swelling portion only near the edge of the doped polysilicon layer 4.

The arrangement of the fifth embodiment can be obtained by performing the follower-type smile oxidation process after forming the poly-metal gate 10 and the anti-oxidizing film 7. The formation of the smile oxide film 6 extending along the side surface of the doped polysilicon layer 4 is limited only to the edge of the doped polysilicon layer 4. Thus, this arrangement is surely obtained by performing the follower-type smile oxidation process from the fact that the anti-oxidizing film 7, straddling between the smile oxide film 6 and the tungsten layer 5 for connecting them, is made of a material having an oxygen diffusion rate smaller than that of the polysilicon.

Accordingly, the fifth embodiment provides a MOS transistor arrangement which is capable of reducing the gate electrode resistance as an effect of using the tungsten layer 5 and is also capable of reducing the leak current as an effect of forming the smile oxide film 6. In addition, it is possible to suppress the interface resistance between the tungsten layer 5 and the smile oxide film 6 from increasing. Thus, the fifth embodiment provides a gate arrangement suitable for realizing a fine dimensional structure.

According to the disclosed arrangement of the fifth embodiment, the thickness of the smile oxide film 6 is 5 nm at the central portion thereof and is maximized to 10 nm at the portion corresponding to the edge of the doped polysilicon layer 4. The doped polysilicon layer 4 has a phosphorus concentration of $1 \times 10^{22}/cm^3$.

<Sixth Embodiment>

Figure 13:
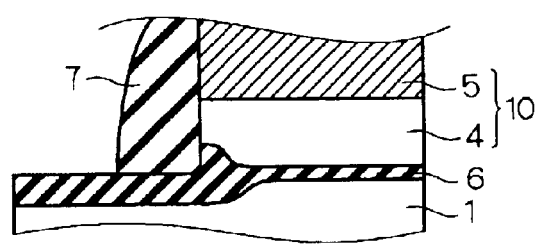
FIG. 13 is a cross-sectional diagram showing the gate arrangement of a MOS transistor in accordance with a sixth embodiment of the present invention.

FIG. 13 is a cross-sectional diagram showing the gate arrangement of a MOS transistor in accordance with a sixth embodiment of the present invention. As shown in this drawing, the sixth embodiment is characterized in that the oxidation of the smile oxide film 6 partly develops into the silicon substrate 1. The rest of the sixth embodiment is identical with that of the fifth embodiment.

The arrangement of the sixth embodiment can be obtained by performing the follower-type smile oxidation process after forming the poly-metal gate 10 and the anti-oxidizing film 7. During the follower-type smile oxidation process, the oxidation of the smile oxide film 6 partly develops into the silicon substrate 1.

Accordingly, the sixth embodiment provides a MOS transistor arrangement which is capable of reducing the gate electrode resistance as an effect of using the tungsten layer 5 and is also capable of reducing the leak current as an effect of forming the smile oxide film 6. Furthermore, forming the smile oxide film 6 having an enlarged thickness as a result of development into the silicon substrate 1 is advantageous in that the leak current can be further reduced.

Moreover, the arrangement of the smile oxide film 6 disclosed in the sixth embodiment is also applicable to the third or fourth embodiment.

According to the disclosed arrangement of the sixth embodiment, the thickness of the smile oxide film 6 is 5 nm at the central portion thereof and is maximized to 10 nm at the portion corresponding to the edge of the doped polysilicon layer 4. The thickness of the smile oxide film 6 is 8 nm in the region thickened into the silicon substrate 1. The doped polysilicon layer 4 has a phosphorus concentration of $1 \times 10^{22}/cm^3$.

<Seventh Embodiment>

Figure 14:
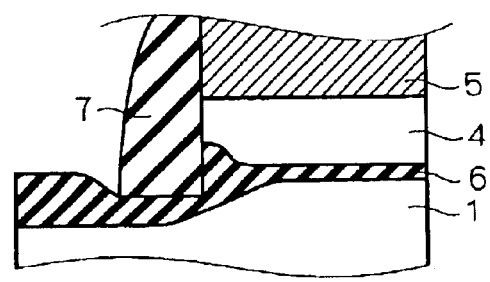
FIG. 14 is a cross-sectional diagram showing the gate arrangement of a MOS transistor in accordance with a seventh embodiment of the present invention.

FIG. 14 is a cross-sectional diagram showing the gate arrangement of a MOS transistor in accordance with a seventh embodiment of the present invention. As shown in this drawing, the seventh embodiment is characterized in that the oxidation of the smile oxide film 6 partly develops into the silicon substrate 1 and also in that the smile oxide film 6 has a swelling portion with an enlarged film thickness in the region outside the gate edge. The rest of the seventh embodiment is identical with that of the fifth embodiment.

The arrangement of the seventh embodiment can be obtained by performing the follower-type smile oxidation process after forming the poly-metal gate 10 and the anti-oxidizing film 7. During the formation of the anti-oxidizing film 7, the anti-oxidizing film 7 is slightly sunken into the silicon substrate 1. The anti-oxidizing film 7 being sunken in this manner brings the effect of adequately suppressing the oxidation occurring beneath the bottom of anti-oxidizing film 7. Thus, the development of the smile oxide film 6 into the silicon substrate 1 is moderate in this region.

Accordingly, the seventh embodiment provides a MOS transistor arrangement which is capable of reducing the gate electrode resistance as an effect of using the tungsten layer 5 and is also capable of reducing the leak current as an effect of forming the smile oxide film 6. Furthermore, the moderate development of the smile oxide film 6 into the silicon substrate 1 brings the effect of relieving the concentration of electric field and/or stress to the gate oxide film and accordingly providing a structure robust against hot carriers, thereby improving the hot carrier reliability.

The arrangement of the smile oxide film 6 disclosed in the seventh embodiment is also applicable to the third or fourth embodiment.

According to the disclosed arrangement of the seventh embodiment, the thickness of the smile oxide film 6 is 5 nm at the central portion thereof and is maximized to 10 nm at the portion corresponding to the edge of the doped polysilicon layer 4. The thickness of the smile oxide film 6 is 8 nm in the region thickened into the silicon substrate 1 (although an offset of the deepest portion from the gate edge is set to 2 nm). The doped polysilicon layer 4 has a phosphorus concentration of $1 \times 10^{22}/cm^3$.

<Eighth Embodiment>

Figure 15:
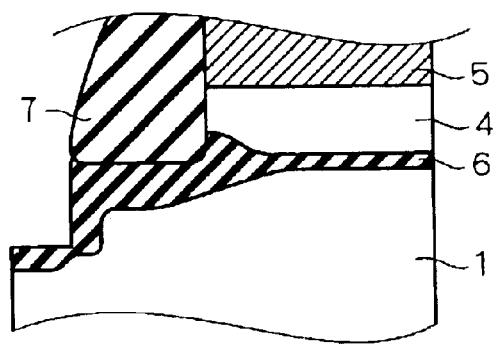
FIG. 15 is a cross-sectional diagram showing the gate arrangement of a MOS transistor in accordance with an eighth embodiment of the present invention.

FIG. 15 is a cross-sectional diagram showing the gate arrangement of a MOS transistor in accordance with an eighth embodiment of the present invention. As shown in this drawing, the eighth embodiment is characterized in that the oxidation of the smile oxide film 6 partly develops into the silicon substrate 1 and the formation of anti-oxidizing film 7 prevents the smile oxide film 6 from growing above the silicon substrate 1. The rest of the eighth embodiment is identical with that of the fifth embodiment.

FIGS. 16 through 20 are cross-sectional diagrams showing a manufacturing method of the MOS transistor in accordance with the eighth embodiment. Hereinafter, the manufacturing method of the eighth embodiment will be explained with reference to these drawings.

Figure 16:
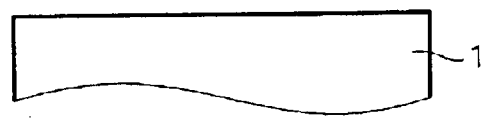
FIGS. 16 through 20 are cross-sectional diagrams showing a manufacturing method of the MOS transistor in accordance with the eighth embodiment of the present invention.

First, as shown in FIG. 16, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Figure 17:
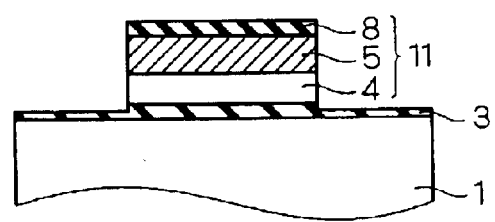

Subsequently, as shown in FIG. 17, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 18:
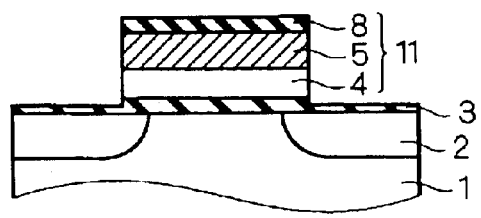

Next, as shown in FIG. 18, the source and drain regions 2 are formed in the upper portion or surface of the silicon substrate 1 by performing injection of phosphorus under the conditions that an injection energy is set to 30 eV and a dose amount is $2 \times 10^{13}/cm^2$, while the three-layer poly-metal gate 11 is used as a mask.

Figure 19:
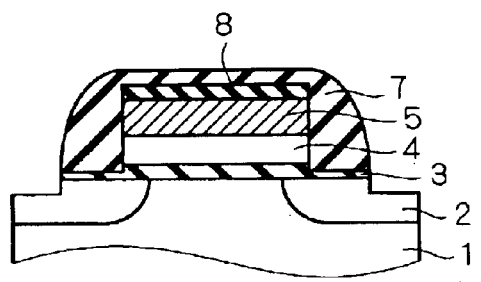

Then, as shown in FIG. 19, the anti-oxidizing film 7 is formed around the three-layer poly-metal gate 11 so that the three-layer poly-metal gate 11 is not exposed to the surrounding atmosphere. Then, the etch back process is applied to the anti-oxidizing film 7 to form the sidewall portion (i.e., a portion neighboring the three-layer poly-metal gate 11) with a width of 2 nm. In this case, a portion of $SiO_2$ film 3 not covered by the anti-oxidizing film 7 is completely removed and the surface of the silicon substrate 1 is etched by a depth of 0.2 nm from the surface of the silicon substrate 1.

Figure 20:
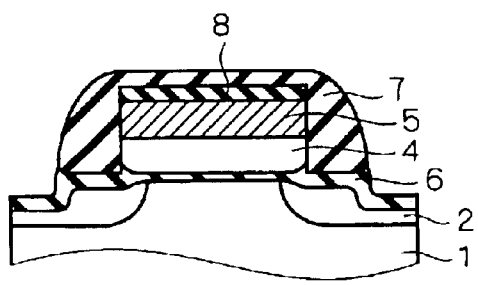

Next, the smile oxidation process is performed by FA (i.e., furnace anneal) satisfying the conditions that the temperature is set to 900° C. in a dry atmosphere and an offset from the gate edge is 1.5 nm. FIG. 20 shows the smile oxide film 6 obtained through the smile oxidation process. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm). The smile oxide film 6 thus obtained serves as the gate oxide film.

Meanwhile, prior to the smile oxidation process, the silicon substrate 1 is already removed by etching at the region outside the sidewall portion of the anti-oxidizing film 7. Hence, the oxidation develops from the side surface of the silicon substrate 1 which is exposed by etching. The smile oxide film 6 moderately expands into the silicon substrate 1 so as to form a stepped-down configuration in the region outside the sidewall portion of the anti-oxidizing film 7. Accordingly, the smile oxide film 6 does not grow above the silicon substrate 1 at the region outside the anti-oxidizing film 7.

As described above, the eighth embodiment provides a MOS transistor arrangement which is capable of reducing the gate electrode resistance as an effect of using the tungsten layer 5 and is also capable of reducing the leak current as an effect of forming the smile oxide film 6.

Furthermore, the moderate development of the smile oxide film 6 into the silicon substrate 1 brings the effect of relieving the concentration of electric field and/or stress to the gate oxide film and accordingly improves the hot carrier reliability. Moreover, the eighth embodiment prevents the oxygen from entering into the doped polysilicon layer 4 and into the tungsten layer 5. This effectively prevents the alteration of metal (i.e., the tungsten layer 5), thereby suppressing the sheet resistance increasing in the metal.

Like the seventh embodiment, the eighth embodiment employs the arrangement of the smile oxide film 6 moderately developing into the silicon substrate 1. However, it is possible to employ the arrangement of the smile oxide film 6 disclosed in the sixth embodiment according to which the development of the smile oxide film 6 into the silicon substrate 1 is deepest at the region beneath the gate.

<Ninth Embodiment>

Figure 21:
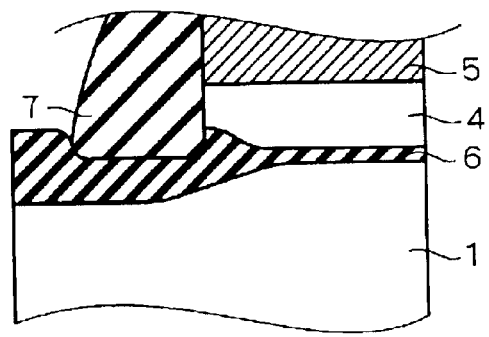
FIG. 21 is a cross-sectional diagram showing the gate arrangement of a MOS transistor in accordance with a ninth embodiment of the present invention.

FIG. 21 is a cross-sectional diagram showing the gate arrangement of a MOS transistor in accordance with a ninth embodiment of the present invention. As shown in this drawing, the ninth embodiment is characterized in that the oxidation of the smile oxide film 6 partly develops into the silicon substrate 1 and also grows above the silicon substrate 1 in the region outside the sidewall portion of the anti-oxidizing film 7. The rest of the ninth embodiment is identical with that of the eighth embodiment.

FIGS. 22 through 26 are cross-sectional diagrams showing a manufacturing method of the MOS transistor in accordance with the ninth embodiment. Hereinafter, the manufacturing method of the ninth embodiment will be explained with reference to these drawings.

Figure 22:
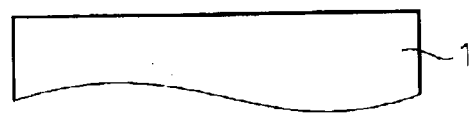
FIGS. 22 through 26 are cross-sectional diagrams showing a manufacturing method of the MOS transistor in accordance with the ninth embodiment of the present invention.

First, as shown in FIG. 22, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Figure 23:
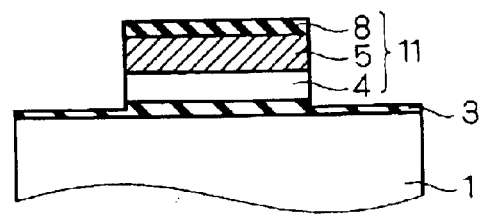

Subsequently, as shown in FIG. 23, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 24:
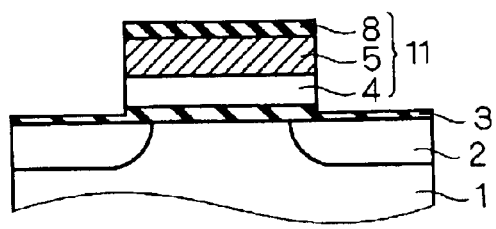

Next, as shown in FIG. 24, the source and drain regions 2 are formed in the upper portion or surface of the silicon substrate 1 by performing injection of phosphorus under the conditions that an injection energy is set to 30 eV and a dose amount is $2 \times 10^{13}/cm^2$, while the three-layer poly-metal gate 11 is used as a mask.

Figure 25:
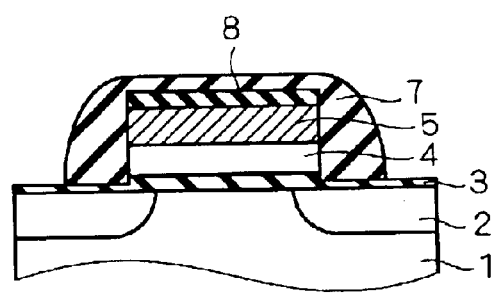

Then, as shown in FIG. 25, the anti-oxidizing film 7 is formed around the three-layer poly-metal gate 11 so that the three-layer poly-metal gate 11 is not exposed to the surrounding atmosphere. Then, the etch back process is applied to the anti-oxidizing film 7 to form the sidewall portion with a width of 2 nm. In this case, a surficial region of $SiO_2$ film 3 not covered by the anti-oxidizing film 7 is partly removed off so as to leave the remaining portion of the $SiO_2$ film 3 having a film thickness of 0.1 nm.

Figure 26:
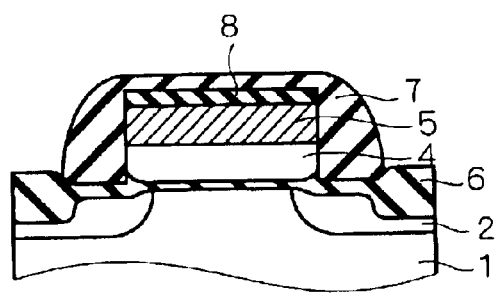

Next, the smile oxidation process is performed by FA (i.e., furnace anneal) satisfying the conditions that the temperature is set to 900° C. in a dry atmosphere and an offset from the edge gate is 1.5 nm. As a result, the arrangement shown in FIG. 26 is obtained. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm).

Meanwhile, prior to the smile oxidation process, the oxidation develops from the upper surface of the silicon substrate 1 in the region outside the anti-oxidizing film 7. Accordingly, the smile oxide film 6 grows above the silicon substrate 1 at the region outside the anti-oxidizing film 7. As a result, the smile oxide film 6 grows in both the upper and lower directions to leave a swelling portion thick in the width. The thicken smile oxide film 6 is effective to reduce the leak current.

Accordingly, the ninth embodiment provides a MOS transistor arrangement which is capable of reducing the gate electrode resistance as an effect of using the tungsten layer 5 and is also capable of reducing the leak current as an effect of forming the smile oxide film 6.

Furthermore, the moderate development of the smile oxide film 6 into the silicon substrate 1 brings the effect of relieving the concentration of electric field and/or stress to the gate oxide film and accordingly improves the hot carrier reliability. Moreover, the ninth embodiment prevents the oxygen from entering into the doped polysilicon layer 4 and into the tungsten layer 5. This effectively prevents the alteration of metal (i.e., the tungsten layer 5), thereby suppressing the sheet resistance increasing in the metal.

Furthermore, during the etch back process of the anti-oxidizing film 7, the inside of the silicon substrate 1 can be prevented from being damaged. The leak current can be reduced. This effect leads to an improvement of refresh properties when the MOS transistor of the ninth embodiment is used for a DRAM (i.e., dynamic random access memory).

Like the seventh embodiment, the ninth embodiment employs the arrangement of the smile oxide film 6 moderately developing into the silicon substrate 1. However, it is possible to employ the arrangement of the smile oxide film 6 disclosed in the sixth embodiment according to which the development of the smile oxide film 6 into the silicon substrate 1 is deepest at the region beneath the gate. Furthermore, it is possible to perform a diffusion process of the source and drain regions 2 together with the smile oxidation process of the smile oxide film 6.

<Tenth Embodiment>

Figure 27:
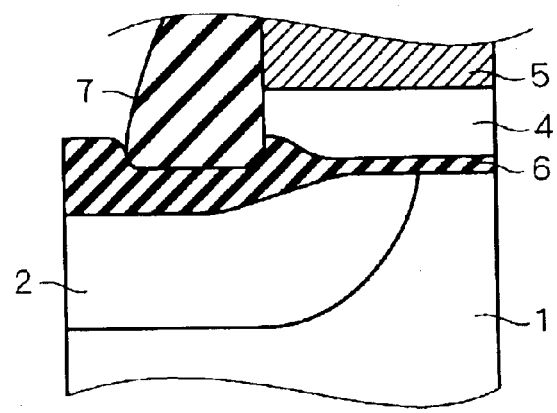
FIG. 27 is a cross-sectional diagram showing the gate arrangement of a MOS transistor in accordance with a tenth embodiment of the present invention.

FIG. 27 is a cross-sectional diagram showing the gate arrangement of a MOS transistor in accordance with a tenth embodiment of the present invention. As shown in this drawing, the tenth embodiment is characterized in that the source and drain regions 2 are formed by offset injection. The rest of the tenth embodiment is identical with that of the ninth embodiment.

According to the tenth embodiment, in addition to the effects of the ninth embodiment, the offset injection makes it possible to form a relatively long gap between the source and drain regions 2 compared with the gate length, regardless of diffusion growth in the succeeding diffusion process. Thus, the MOS transistor of the tenth embodiment has excellent punch through durability and is suitable for a fine dimensional structure.

Furthermore, as described later, compared with the source and drain regions formed by the ordinary method, the usage of the offset injection makes it possible to provide the source and drain regions containing impurities diffused deeply. Thus, the sheet resistance in the diffusion layer of the source and drain regions decreases. An increased amount of drain current is supplied.

During the offset injection, it is possible to increase the diffusion time to form the source and drain regions extending beneath the gate electrode as shown in FIG. 27.

FIGS. 28 through 33 are diagrams explaining an offset injection arrangement in accordance with the tenth embodiment. Hereinafter, the offset injection arrangement of the tenth embodiment will be explained with reference to these drawings.

Figure 28:
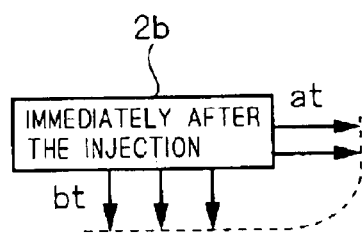
FIG. 28 is a view explaining a source or drain region having been subjected to a doping process.
Figure 29:
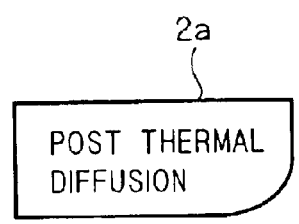
FIG. 29 is a view explaining the source or drain region having been subjected to a thermal diffusion process.

FIG. 28 is a view explaining the profile in the condition immediately after the injection of diffusion source. In this drawing, 'a' represents a lateral diffusion rate and 'b' represents a vertical diffusion rate in the source/drain region 2b. FIG. 29 shows a post thermal diffusion source/drain region 2a obtained after the time passage of 't'. Namely, the source/drain region 2b diffuses in the lateral direction by an amount of 'at' as well as in the vertical direction by an amount of 'bt' during the thermal diffusion of time t.

Figure 30:
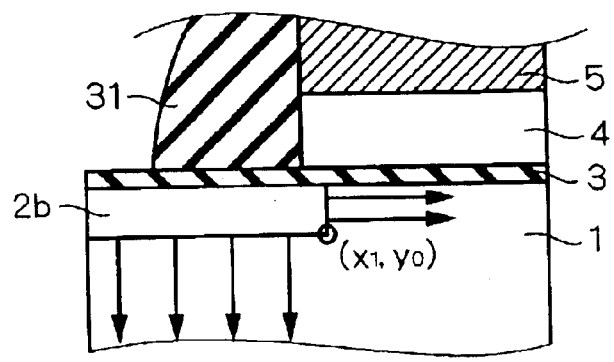
FIGS. 30 through 33 are cross-sectional diagrams explaining an offset injection structure.
Figure 31:
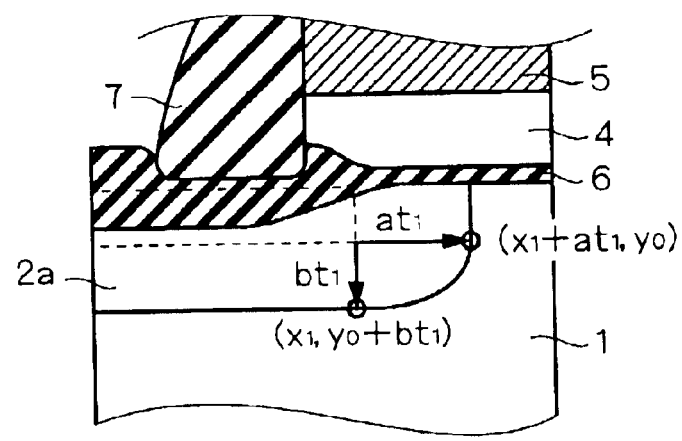

According to an ordinary method for forming the source/drain region, as shown in FIG. 30, the gate electrode (i.e., the doped polysilicon layer 4, the tungsten layer 5 etc.) is formed (and the smile oxidation process, i.e., selective oxidation, is applied) and then the immediately-after the injection source/drain region 2b (expressed by the edge portion coordinate (x1, y0)) is obtained prior to the formation of a sidewall 31. Subsequently, through the diffusion process for a period of time t1, the source/drain region 2b expands in both lateral and vertical directions. FIG. 31 shows the post thermal diffusion source/drain region 2a (expressed by the shifted edge portion coordinates (x1+at 1, y0) and (x1, y0+bt1)) obtained as a result of the thermal diffusion of time t1.

Figure 32:
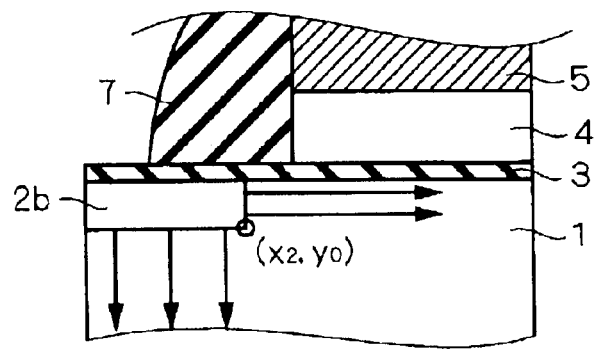
Figure 33:
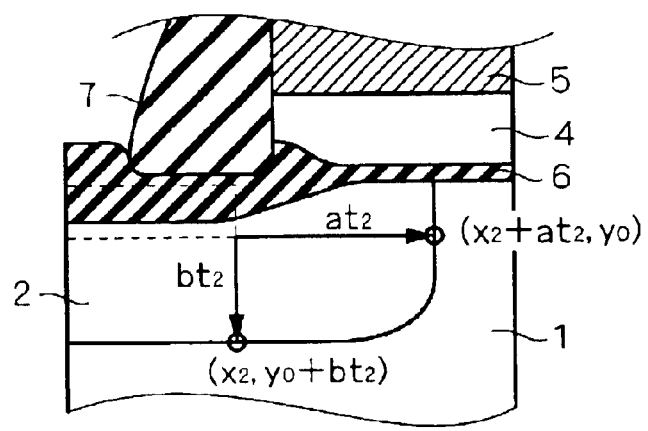

On the other hand, according to the offset injection of the tenth embodiment is performed, as shown in FIG. 32, the gate electrode and the anti-oxidizing film 7 are formed and then the immediately-after the injection source/drain region 2b (expressed by the edge portion coordinate (x2(<x1), y0)) is obtained. Subsequently, through the diffusion process for a period of time t2, the source/drain region 2b expands in both lateral and vertical directions. FIG. 33 shows the post thermal diffusion source/drain region 2a (expressed by the laterally shifted edge portion coordinate (x2+at 2, y0) and the vertically shifted edge portion coordinate (x2, y0+bt2)) obtained as a result of the thermal diffusion of time t2.

It is now assumed that the same source-drain gap is set in each of the ordinary method and the offset injection. Namely, t2(>t1) is set so as to satisfy the conditions x1+at 1=x2+at 2. In this case, it is apparent that the relationship y0+bt2>y0+bt1 inevitably satisfied. Accordingly, the tenth embodiment makes it possible to obtain a deeper source/drain region 2.

As described above, when the source-drain gap is fixed to a predetermined distance, the offset injection of the tenth embodiment is superior to the ordinary method in that the depth of the source/drain region 2 resulting from the offset injection is deeper than the other.

First Manufacturing

FIGS. 34 through 38 are cross-sectional diagrams showing a first manufacturing method in accordance with the tenth embodiment. Hereinafter, the first manufacturing method of the tenth embodiment will be explained with reference to these drawings.

First, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Figure 34:
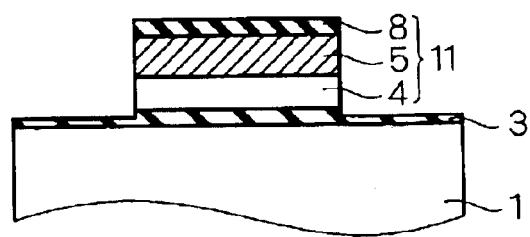
FIGS. 34 through 38 are cross-sectional diagrams showing a first manufacturing method of the MOS transistor in accordance with the tenth embodiment of the present invention.

Subsequently, as shown in FIG. 34, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 35:
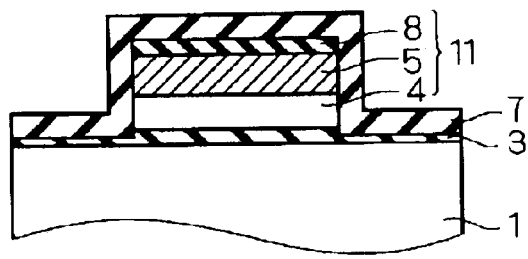

Next, as shown in FIG. 35, the anti-oxidizing film 7 made of $Si_3N_4$ is formed according to the CVD (i.e., chemical vapor deposition) method so as to entirely cover the three-layer poly-metal gate 11 with a film thickness of 2.5 nm.

Figure 36:
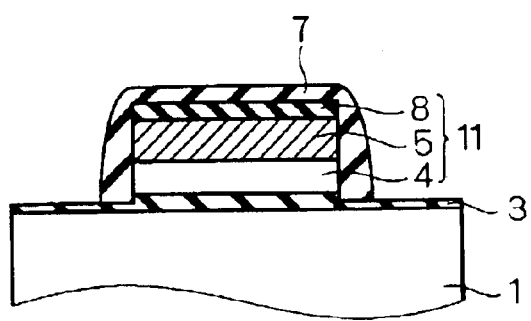

Subsequently, as shown in FIG. 36, the etch back process is applied to the anti-oxidizing film 7 to form the sidewall portion with a width of 2 nm entirely covering the three-layer poly-metal gate 11. In this case, a surficial region of $SiO_2$ film 3 not covered by the anti-oxidizing film 7 is partly removed off so as to leave the remaining portion of the $SiO_2$ film 3 having a film thickness of 0.1 nm. Accordingly, as an effect of the $SiO_2$ film 3 remaining on the silicon substrate 1, it becomes possible to prevent the inside of the silicon substrate 1 from being damaged during the etch back process.

Figure 37:
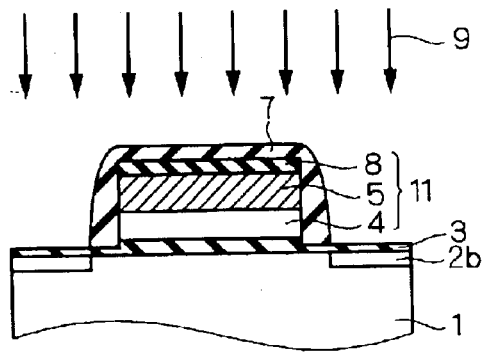

Next, as shown in FIG. 37, the injection of phosphorus ions 9 is performed under the conditions that an injection energy is set to 30 keV and a dose amount is $2 \times 10^{13}/cm^2$, while the three-layer poly-metal gate 11 and the sidewall portion of anti-oxidizing film 7 are used as a mask, thereby forming the immediately-after the injection source and drain regions 2b in the upper portion or surface of the silicon substrate 1.

Figure 38:
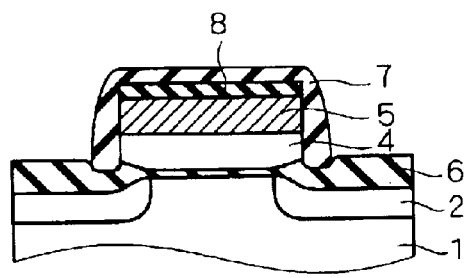

Next, the smile oxidation process is performed by FA (i.e., furnace anneal) satisfying the conditions that the temperature is set to 900° C. in a dry atmosphere and an offset from the edge gate is 1.5 nm. As a result, the arrangement shown in FIG. 38 is obtained. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm).

At the same time, through the thermal diffusion process, the immediately-after the injection source/drain region 2b expands or grows into the post thermal diffusion source/drain region 2a. In this case, the post thermal diffusion source/drain region 2a extends along the bottom of the gate electrode by an amount of 0.01 $\mu$m from the gate edge, with the depth of 0.05 $\mu$m.

Accomplishing the above-described manufacturing processes makes it possible to obtain the arrangement of the tenth embodiment which is characterized by the source/drain region formed by the offset injection.

Figure 39:
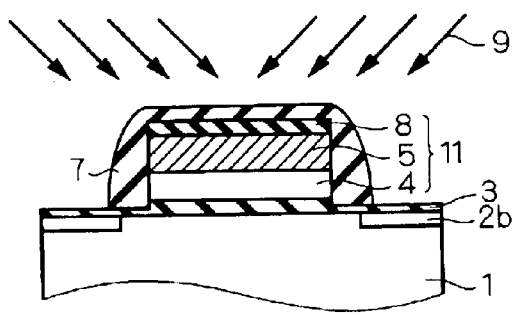
FIG. 39 is a cross-sectional diagram showing a modified first manufacturing method of the MOS transistor in accordance with the tenth embodiment of the present invention.

FIG. 39 is a cross-sectional diagram showing a modified first manufacturing method of the MOS transistor in accordance with the tenth embodiment. The above-described processes explained with reference to FIG. 37 are replaceable with the processes explained with reference to FIG. 39.

As shown in FIG. 39, the immediately-after the injection source/drain region 2b can be formed by injecting the phosphorus ions 9 under the conditions that an injection energy is set to 45 keV, a dose amount is $2 \times 10^{13}/cm^2$, and a rotational angle is 45°. In this case, the sidewall portion of anti-oxidizing film 7 is 3 nm in width. In this manner, the impurity injection can be performed by using the oblique rotation.

Second Manufacturing

FIGS. 40 through 44 are cross-sectional diagrams showing a second manufacturing method in accordance with the tenth embodiment. Hereinafter, the second manufacturing method of the tenth embodiment will be explained with reference to these drawings.

First, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Figure 40:
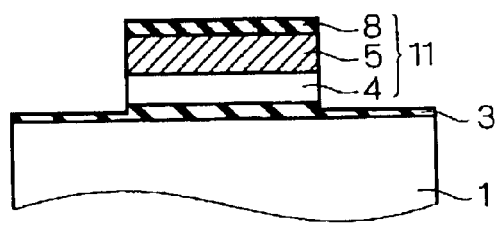
FIGS. 40 through 44 are cross-sectional diagrams showing a second manufacturing method of the MOS transistor in accordance with the tenth embodiment of the present invention.

Subsequently, as shown in FIG. 40, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 41:
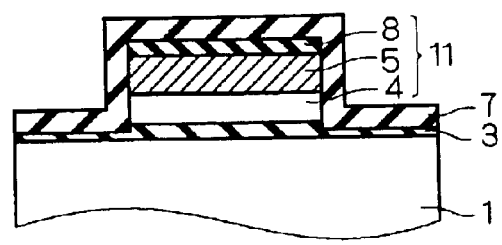

Next, as shown in FIG. 41, the anti-oxidizing film 7 made of $Si_3N_4$ is formed according to the CVD method so as to entirely cover the three-layer poly-metal gate 11 with a film thickness of 2.5 nm.

Figure 42:
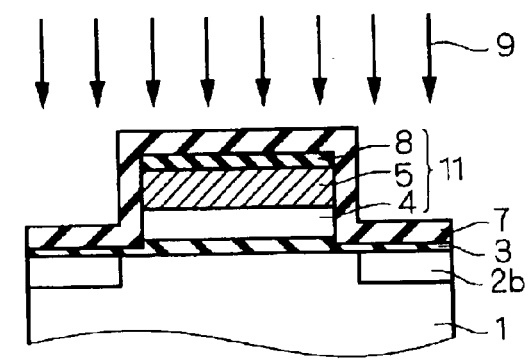

Subsequently, as shown in FIG. 42, the injection of phosphorus ions 9 is performed under the conditions that an injection energy is set to 50 keV and a dose amount is $2 \times 10^{13}/cm^2$ while the three-layer poly-metal gate 11 and the anti-oxidizing film 7 are used as a mask, thereby forming the immediately-after the injection source and drain regions 2b in the upper portion or surface of the silicon substrate 1.

According to the second manufacturing method, from the necessity of penetrating a thick wall of oxidizing film 7, the injection energy of the phosphorus ions 9 is set to a larger value compared with that in the first manufacturing method. Accordingly, the distribution of impurities in the immediately-after the injection source and drain regions 2b becomes board compared with that in the first manufacturing method.

Figure 43:
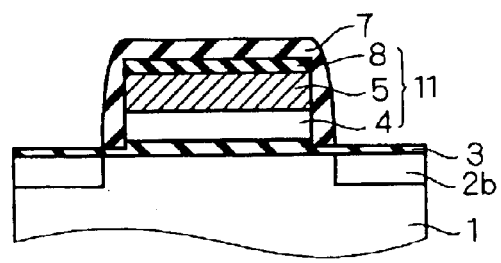

Thereafter, as shown in FIG. 43, the etch back process is applied to the anti-oxidizing film 7 to form the sidewall portion with a width of 2 nm entirely covering the three-layer poly-metal gate 11 without exposing. In this case, a surficial region of $SiO_2$ film 3 not covered by the anti-oxidizing film 7 is partly removed off so as to leave the remaining portion of the $SiO_2$ film 3 having a film thickness of 0.1 nm. Accordingly, like the first manufacturing method, it becomes possible to prevent the inside of the silicon substrate 1 from being damaged during the etch back process as an effect of the $SiO_2$ film 3 remaining on the silicon substrate 1.

Figure 44:
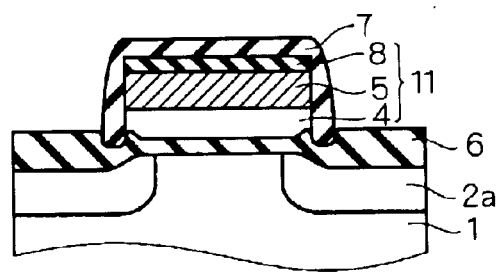

Next, the smile oxidation process is performed by FA (i.e., furnace anneal) satisfying the conditions that the temperature is set to 900° C. in a dry atmosphere and an offset from the edge gate is 1.5 nm. As a result, the arrangement shown in FIG. 44 is obtained. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm).

At the same time, through the thermal diffusion process, the immediately-after the injection source/drain region 2b expands or grows into the post thermal diffusion source/drain region 2a. In this case, the post thermal diffusion source/drain region 2a extends along the bottom of the gate electrode by an amount of 0.01 μm from the gate edge, with the depth of 0.05 μm.

As the impurity distribution in the immediately-after the injection source/drain region 2b is broad, the impurity distribution in the post thermal diffusion source/drain region 2a becomes broad too. Accordingly, the depletion layer tends to spread widely in the post thermal diffusion source/drain region 2a. This effectively relieves the electric field in the junction between the silicon substrate 1 and the source/drain region 2, and also reduces the leak current.

Accomplishing the above-described manufacturing processes makes it possible to obtain the arrangement of the tenth embodiment which is characterized by the source/drain region formed by the offset injection.

Figure 45:
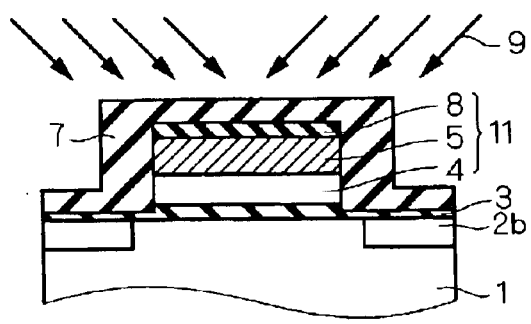
FIG. 45 is a cross-sectional diagram showing a modified second manufacturing method of the MOS transistor in accordance with the tenth embodiment of the present invention.

FIG. 45 is a cross-sectional diagram showing a modified second manufacturing method of the MOS transistor in accordance with the tenth embodiment. The above-described processes explained with reference to FIG. 42 are replaceable with the processes explained with reference to FIG. 45.

As shown in FIG. 45, the immediately-after the injection source/drain region 2b can be formed by injecting the phosphorus ions 9 under the conditions that an injection energy is set to 65 keV, a dose amount is $2 \times 10^{13}/cm^2$, and a rotational angle is 30°. In this case, the film thickness of the anti-oxidizing film 7 is set to 3 nm. In this manner, the impurity injection can be performed by using the oblique rotation.

Third Manufacturing

FIGS. 46 through 50 are cross-sectional diagrams showing a third manufacturing method in accordance with the tenth embodiment. Hereinafter, the third manufacturing method of the tenth embodiment will be explained with reference to these drawings.

First, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Figure 46:
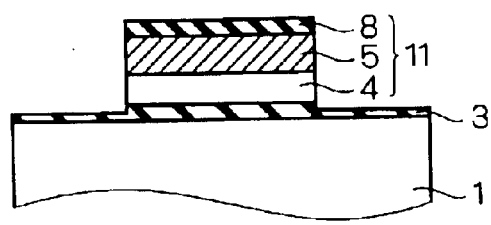

Subsequently, as shown in FIG. 46, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 47:
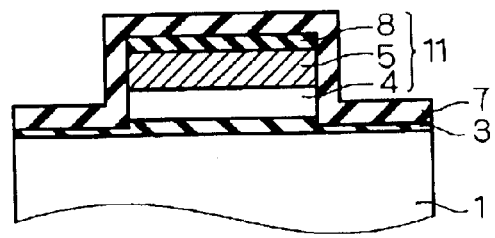

Next, as shown in FIG. 47, the anti-oxidizing film 7 made of $Si_3N_4$ is formed according to the CVD method so as to entirely cover the three-layer poly-metal gate 11 with a film thickness of 2.5 nm.

Figure 48:
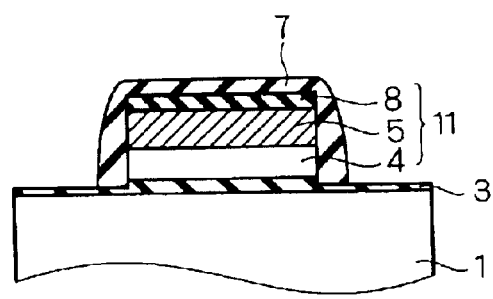

Subsequently, as shown in FIG. 48, the etch back process is applied to the anti-oxidizing film 7 to form the sidewall portion with a width of 2 nm entirely covering the three-layer poly-metal gate 11 without exposing. In this case, a surficial region of $SiO_2$ film 3 not covered by the anti-oxidizing film 7 is partly removed off so as to leave the remaining portion of the $SiO_2$ film 3 having a film thickness of 0.1 nm. Accordingly, like the first manufacturing method, it becomes possible to prevent the inside of the silicon substrate 1 from being damaged during the etch back process as an effect of the $SiO_2$ film 3 remaining on the silicon substrate 1.

Next, the smile oxidation process is performed by FA (i.e., furnace anneal) satisfying the conditions that the temperature is set to 900° C. in a dry atmosphere and an offset from the edge gate is 1.5 nm. As a result, the arrangement shown in FIG. 49 is obtained. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm).

Next, as shown in FIG. 50, the injection of phosphorus ions 9 is performed under the conditions that an injection energy is set to 150 keV, a dose amount is $2 \times 10^{13}/cm^2$, and a rotation angle is 45°, while the three-layer poly-metal gate 11 and the anti-oxidizing film 7 having the sidewall structure are used as a mask. Subsequently, the diffusion process is applied to form the source and drain regions 2 in the upper portion or surface of the silicon substrate 1. If necessary, the thermal diffusion process can be used for the growth of the source and drain regions 2. In this case, the source/drain region 2 extends along the bottom of the gate electrode by an amount of 0.01 μm from the gate edge, with the depth of 0.05 μm.

Accomplishing the above-described manufacturing processes makes it possible to obtain the arrangement of the tenth embodiment which is characterized by the source/drain region formed by the offset injection.

According to the third manufacturing method, the source and drain regions 2 are formed after finishing the slime oxidation process. Accordingly, the source and drain regions 2 are not subjected to the smile oxidation processing. It is hence possible to prevent the source and drain regions 2 from spreading due to the high-temperature treatment. In this respect, the third manufacturing method of the tenth embodiment provides the MOS transistor which has excellent punch through durability and is suitable for a fine dimensional structure.

The tenth embodiment is similar to the seventh embodiment in that the smile oxide film 6 moderately develops into the silicon substrate 1. However, it is possible to modify the tenth embodiment to employ the arrangement of the smile oxide film 6 disclosed in the sixth embodiment according to which the development of the smile oxide film 6 into the silicon substrate 1 is deepest at the region beneath the gate.

Furthermore, to relieve the stress, it is possible to add a thermal treatment after finishing the smile oxidation process shown in FIG. 49. Performing the thermal treatment in this manner surely relieves the stress caused during the formation of the smile oxide film 6 and accordingly improves the hot carrier reliability as well as the oxide film reliability. Regarding the practical thermal treatment used in this case, it is preferable to perform RTN (i.e., rapid thermal annealing using nitrogen) at the temperature of 1,100° C. for 30 seconds.

In the above case, it will be preferable to perform the injection of phosphorus ions 9 explained with reference to FIG. 50 under the conditions that an injection energy is set to 180 keV, a dose amount is $2 \times 10^{13}/cm^2$, and a rotation angle is 45°.

<Eleventh Embodiment>

According to the arrangement of the ninth embodiment, the smile oxide film 6 has the swelling portion (i.e., a portion having the maximized film thickness) deviated toward only one side of the bottom of the sidewall portion of the anti-oxidizing film 7 as shown in FIG. 51.

FIG. 52 is a cross-sectional view showing a MOS transistor arrangement of an eleventh embodiment of the present invention. As shown in this drawing, the swelling portion of the smile oxide film 6 extends entirely beneath the sidewall portion of the anti-oxidizing film 7.

The swelling portion of the smile oxide film 6 sufficiently extending beneath the sidewall portion of the anti-oxidizing film 7 brings the effect of sufficiently enlarging the film thickness of the smile oxide film 6 in the vicinity of the gate edge. Thus, the eleventh embodiment makes it possible to reduce the electric field in the vicinity of the gate edge.

FIGS. 53 through 58 are cross-sectional diagrams showing a manufacturing method in accordance with the eleventh embodiment. Hereinafter, the manufacturing method of the eleventh embodiment will be explained with reference to these drawings.

First, as shown in FIG. 53, the silicon substrate 1 of a P-type is prepared. Next, the $SiO_2$ film 3, having a film thickness of 5 nm, is formed on the entire surface of the silicon substrate 1. Then, the doped polysilicon layer 4, being 50 nm in film thickness and having the phosphorus concentration of $1 \times 10^{22}/cm^3$, is formed on the $SiO_2$ film 3. Then, the tungsten layer 5 having a film thickness of 100 nm is formed on the doped polysilicon layer 4. Then, the SiON layer 8 having a film thickness of 60 nm is formed on the tungsten layer 5.

Subsequently, as shown in FIG. 54, the doped polysilicon layer 4, the tungsten layer 5, and the SiON layer 8 are selectively etched to leave a three-layer poly-metal gate 11 consisting of the non-etched layered portions of the doped polysilicon layer 4, the tungsten layer 5, and the SiON layer 8. During the etching process, a surficial region of the $SiO_2$ film 3 is removed off at the region outside the three-layer poly-metal gate 11. The remaining portion of the $SiO_2$ film 3, outside the three-layer poly-metal gate 11, is 3 nm in film thickness.

Figure 55:
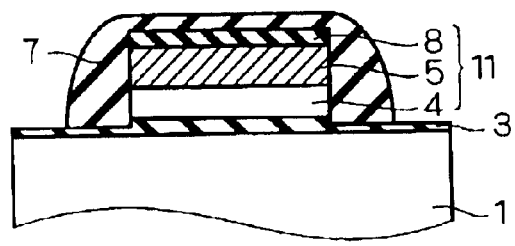

Subsequently, as shown in FIG. 55, the anti-oxidizing film 7 is formed around the three-layer poly-metal gate 11 so that the three-layer poly-metal gate 11 is not exposed to the surrounding atmosphere. Then, the etch back process is applied to the anti-oxidizing film 7 to form the sidewall portion with a width of 2 nm entirely covering the three-layer poly-metal gate 11. In this case, a surficial region of $SiO_2$ film 3 not covered by the anti-oxidizing film 7 is partly removed off so as to leave the remaining portion of the $SiO_2$ film 3 having a film thickness of 0.1 nm. Accordingly, like the ninth embodiment, it becomes possible to prevent the inside of the silicon substrate 1 from being damaged during the etch back process as an effect of the $SiO_2$ film 3 remaining on the silicon substrate 1.

Figure 56:
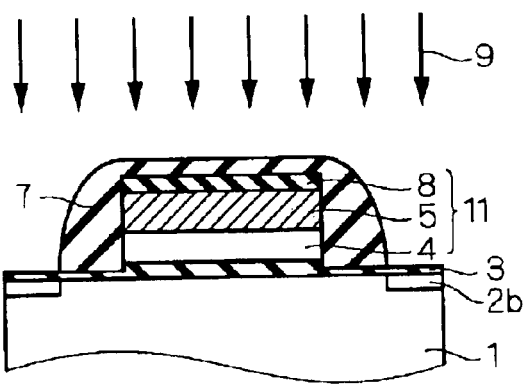

Next, as shown in FIG. 56, the injection of phosphorus ions 9 is performed under the conditions that an injection energy is set to 30 keV and a dose amount is $2 \times 10^{13}/cm^2$, while the three-layer poly-metal gate 11 and the sidewall portion of the anti-oxidizing film 7 are used as a mask, thereby forming the immediately-after the injection source and drain regions 2b in the upper portion or surface of the silicon substrate 1.

Figure 57:
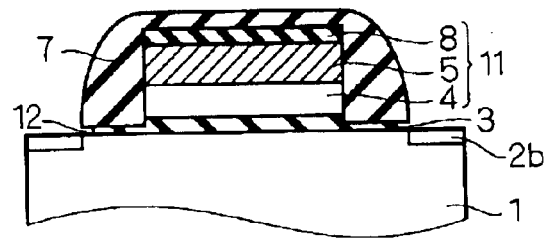

Subsequently, as shown in FIG. 57, a wet oxide film removing process is performed to remove the $SiO_2$ film 3 exposed on the silicon substrate 1. Meanwhile, a portion of $SiO_2$ film 3 located beneath the sidewall portion of the anti-oxidizing film 7 is removed off by the length of approximately 0.5 nm from the outer edge of the sidewall portion, thereby forming a cavity 12 serving as an insertion space between the silicon substrate 1 and the sidewall portion of the anti-oxidizing film 7.

Figure 58:
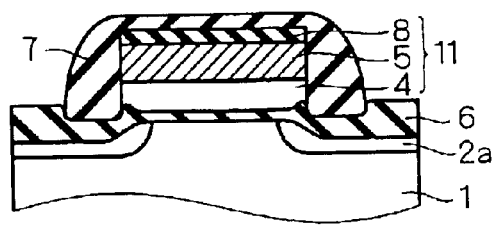
Figure 59:
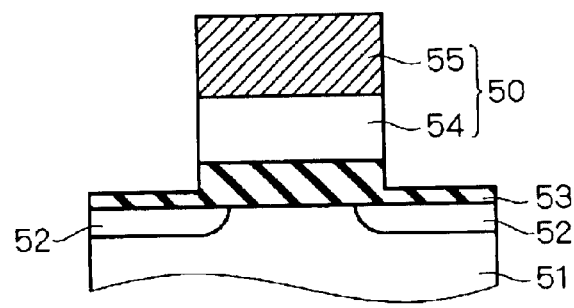
FIG. 59 is a cross-sectional diagram showing a conventional poly-metal gate structure.
Figure 60:
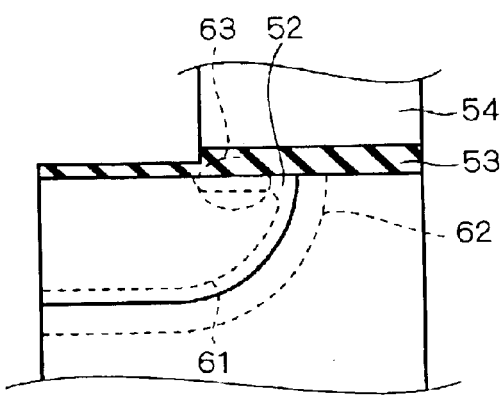
FIG. 60 is a cross-sectional diagram explaining the GIDL phenomenon.
Figure 61:
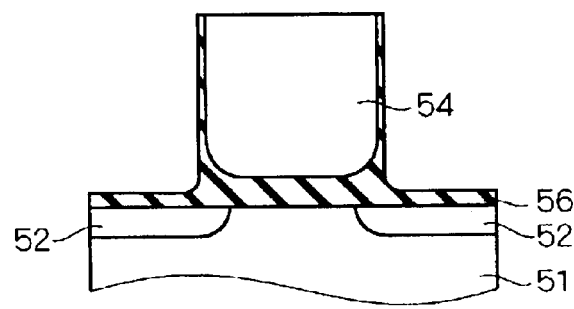
FIG. 61 is a cross-sectional diagram explaining the smile oxidation.
Figure 62:
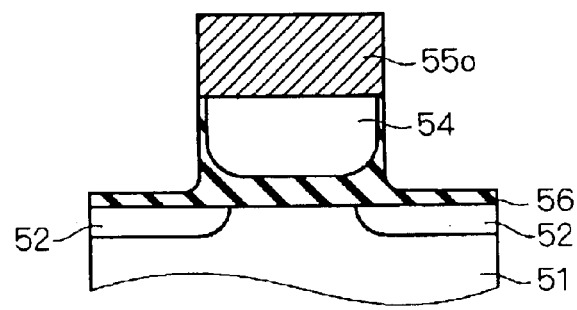
FIG. 62 is a cross-sectional diagram explaining a problem occurring when the smile oxidation process is applied to the poly-metal gate structure.
Figure 63:
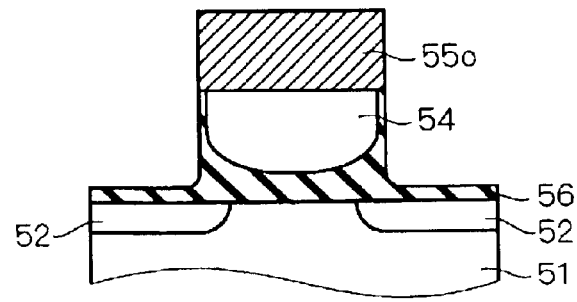
FIG. 63 is a cross-sectional diagram explaining the problem (Part I) peculiar to the selective oxide process.
Figure 64:
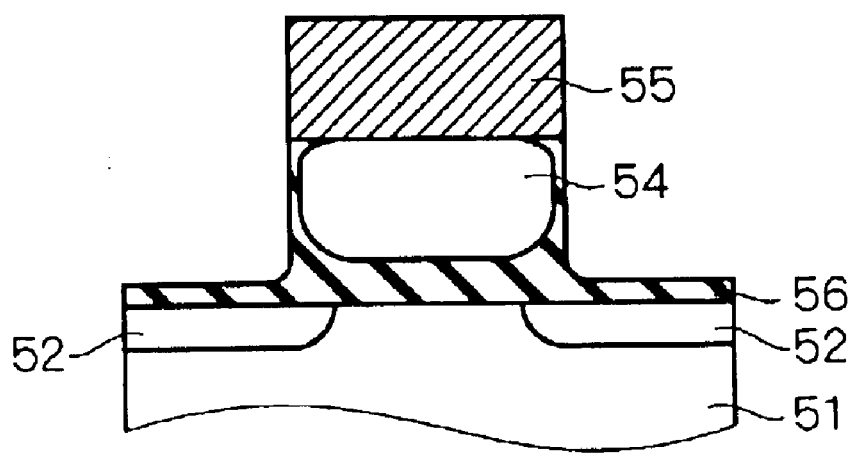
FIG. 64 is a cross-sectional diagram explaining the problem (Part II) peculiar to the selective oxide process.

Next, the smile oxidation process is performed by FA (i.e., furnace anneal) satisfying the conditions that the temperature is set to 900° C. in a dry atmosphere and an offset from the edge gate is 1.5 nm. As a result, the arrangement shown in FIG. 58 is obtained. The film thickness of the obtained smile oxide film 6 is 5 nm at central portion thereof and is maximized to 10 nm at the portion corresponding to the edge of the doped polysilicon layer 4 as a result of the oxidation of the smile oxide film 6 locally developing into the doped polysilicon layer 4 near the gate edge. The thickness of the smile oxide film 6 is 8 nm in the region thickened into the silicon substrate 1 (although an offset of the deepest portion from the gate edge is set to 1.5 nm).

At the same time, through the thermal diffusion process, the immediately-after the injection source/drain region 2b expands or grows into the post thermal diffusion source/drain region 2a.

Regarding the smile oxide film 6, the oxidation develops above the silicon substrate 1 in the region outside the anti-oxidizing film 7. Therefore, the smile oxide film 6 grows upward from the upper surface of the silicon substrate 1 in the region outside the anti-oxidizing film 7.

Providing the cavity 12 is effective to promote the oxidation in the vicinity of the gate edge of the three-layer poly-metal gate 11. Thus, it becomes possible to form the smile oxide film 6 having the swelling portion entirely extending beneath the sidewall portion of the anti-oxidizing film 7.

If the smile oxide film 6 is formed without providing the cavity 12, it will be necessary to reduce the width of the sidewall portion of the anti-oxidizing film 7. According to this method, the immediately-after the injection source/drain region 2b is formed in the vicinity of the gate edge during the injection process of the phosphorus ions 9 shown in FIG. 56. In this case, there is the possibility that the post thermal diffusion source/drain region 2a may develop too much deeply into the silicon substrate 1 beneath the gate from gate edge during the process shown in FIG. 58.

As a result, the source-drain gap will become short and accordingly the punch through durability will be worsened. Hence, the obtained MOS transistor arrangement will not be suitable for fine dimensional structure. On the contrary, the manufacturing method using the cavity 12 can solve the above-described problems and accordingly relieve the electric field of the gate edge without deteriorating the punch through durability.

<Various Modifications>

The following is various modifications applicable to all of the above-described embodiments of the present invention.

Modification I

To relieve the stress, it is preferable to add a thermal treatment after finishing the smile oxidation process. Performing the thermal treatment in this manner surely relieves the stress caused during the formation of the smile oxide film 6 and accordingly improves the hot carrier reliability as well as the oxide film reliability. Regarding the practical thermal treatment used in this case, it is preferable to perform RTN (i.e., rapid thermal annealing using nitrogen) at the temperature of 1,100° C. for 30 seconds.

Modification II

The MOS transistor according to any one of the above-described embodiments is applicable to DRAM. This makes it possible to reduce the leak current in the memory cell and the refresh properties can be improved correspondingly.

Modification III

The MOS transistor according to any one of the above-described embodiments is applicable to embedded DRAM. This makes it possible to reduce the leak current in the memory cell and the refresh properties can be improved correspondingly.

Modification IV

When the MOS transistor according to any one of the above-described embodiments is employed in the DRAM or in the embedded DRAM, if the MOS transistor requires a relatively large amount of current supply, a sufficiently large gate length is provided with respect to a gate bird's beak amount (i.e., a smile oxidized amount of the doped polysilicon layer 4) at the gate edge portion.

For example, when the gate bird's beak amount at one side is 0.03 μm, the gate length of a central transistor in the memory cell is set to 0.1 μm. The gate length of a peripheral or logic MOS transistor requiring a relatively large amount of current supply is set to 0.4 μm. The gate length of a peripheral or logic MOS transistor not requiring a relatively large amount of current supply is set to 0.2 μm.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor device comprising:
   a semiconductor substrate;
   source and drain regions selectively formed in an upper layer portion of said semiconductor substrate;
   a gate oxide film formed on said semiconductor substrate at least in a region between said source and drain regions; and
   a gate electrode formed on said gate oxide film and including at least polysilicon layer, wherein
   said gate oxide film has a first region located beneath an edge of said gate electrode and a second region located beneath a center of said gate electrode,
   a film thickness of said first region of said gate oxide film is larger than a film thickness of said second region of said gate oxide film, and
   said source and drain regions, said gate oxide film and said gate electrode cooperatively comprise a MOS transistor,
   said semiconductor device further comprising:
   an anti-oxidizing film, having a small oxygen diffusion rate compare with said polysilicon layer, which covers and is in direct contact with outer surfaces of said gate electrode so that said gate electrode is not exposed.

2. The semiconductor device according to claim 1, wherein
   said gate electrode further includes:
   a polysilicon layer formed on said gate oxide film; and
   a metal layer formed on said polysilicon layer.

3. The semiconductor device according to claim 2, wherein
   said gate electrode further includes an insulating layer formed on said metal layer.

4. The semiconductor device according to claim 1, wherein
   almost all of a side surface of said polysilicon layer is not an oxidized region.

5. The semiconductor device according to claim 2, wherein
   almost all of a side surface of said polysilicon layer is an oxidized region, and almost all of an interface between said polysilicon layer and said metal layer is not oxidized region.

6. The semiconductor device according to claim 1, wherein
   said gate oxide film partly develops into said semiconductor substrate.

7. The semiconductor device according to claim 6, wherein
   said gate oxide film has a swelling portion having a maximum film thickness at a region other than beneath said gate electrode.

8. The semiconductor device according to claim 6, wherein
   said gate oxide film is formed outside a region beneath said gate electrode so as to grow only below an upper surface of said semiconductor substrate.

9. The semiconductor device according to claim 6, wherein
   said gate oxide film is formed outside a region beneath said gate electrode so as to grow above and below an upper surface of said semiconductor substrate.

10. The semiconductor device according to claim 9, wherein
    said gate oxide film has a swelling portion having a maximum film thickness and extending along an entire bottom region of said anti-oxidizing film formed next to a side surface of said gate electrode.

* * * * *